(12) United States Patent
Kuo et al.

(10) Patent No.: US 7,289,359 B2
(45) Date of Patent: Oct. 30, 2007

(54) SYSTEMS AND METHODS FOR USING A SINGLE REFERENCE CELL IN A DUAL BIT FLASH MEMORY

(75) Inventors: Nai-Ping Kuo, Hsin-Chu (TW);
Han-Sung Chen, Hsin-Chu (TW);
Ken-Hui Chen, Hsin-Chu (TW);
Chun-Hsiung Hung, Hsin-Chu (TW)

(73) Assignee: Macronix International Co., Ltd. (TW)

( * ) Notice: Subject to any disclaimer, the term of this patent is extended or adjusted under 35 U.S.C. 154(b) by 27 days.

(21) Appl. No.: 11/223,357

(22) Filed: Sep. 9, 2005

(65) Prior Publication Data
US 2007/0058439 A1 Mar. 15, 2007

(51) Int. Cl.
*G11C 11/34* (2006.01)

(52) U.S. Cl. ............................ 365/185.03; 365/185.2; 365/185.33

(58) Field of Classification Search ....... 365/185.03 O, 365/185.2 X, 185.33 X, 185.03, 185.2, 185.33
See application file for complete search history.

(56) References Cited

U.S. PATENT DOCUMENTS

| 6,639,849 | B2 | 10/2003 | Takahashi et al. | |
|---|---|---|---|---|
| 6,690,602 | B1 * | 2/2004 | Le et al. ................. | 365/185.33 |
| 6,700,815 | B2 * | 3/2004 | Le et al. ................. | 365/185.03 |
| 7,064,983 | B2 * | 6/2006 | Maayan et al. ......... | 365/185.2 |

* cited by examiner

*Primary Examiner*—VanThu Nguyen
(74) *Attorney, Agent, or Firm*—Baker & McKenzie LLP

(57) ABSTRACT

A dual bit flash device comprising a core cell array, each cell of the core cell array is configured to store two bits of data, and a single reference array, each cell of the single reference array comprising a first bit programmed to a low threshold voltage and a second bit programmed to a high threshold voltage.

25 Claims, 4 Drawing Sheets

SYSTEMS AND METHODS FOR USING A SINGLE REFERENCE CELL IN A DUAL BIT FLASH MEMORY

BACKGROUND

1. Field of the Invention

The invention relates generally to flash based devices and more particularly to reference circuits and methods for programming reference circuits in dual bit flash memory devices.

2. Background of the Invention

In dual bit flash memory cells, a single cell holds two bits of information. One of the two bits is often referred to as the Normal Bit (NB), while the other is often referred to as the Complimentary Bit (CB). Dual bit flash memory cells use what is known as virtual ground architectures in which the source for one of the two bits serves as the drain for the other. In other words, the cell essentially comprises a gate and two terminals. For one of the two bits, one of the two terminals is the source and the other is the drain. But for the other bit, the function of the two terminals is alternated, such that the terminal that was the source for the first bit is now the drain for the second bit, and vise versa.

In a conventional dual bit flash device, a reference cell is set at a predetermined threshold voltage (Vt). Upon reading data from a core cell, the drain current for the core cell is compared with the drain current for the reference cell. If the read current for the core cell is greater than the reference current for the reference cell, then it is determined that the core cell contains a "1". If, on the other hand, the read current for the core cell is less than the reference current for the reference cell, then it can be determined that the core cell contains a "0".

This approach to reading a core cell has its own problem near the "end of life" for the cell. As the flash device is used over time, the core cells can be subject to as many as 100,000 program/erase cycles. As a core cell is subject to an increasing number of cycles, the Vt for the core cell changes due to various inherent properties associated with the cell that effect reliability over time and as the cell is erased and programmed repeatedly. Reference cells were conventionally programmed only once to the predetermined Vt. As a result, the reference cells do not experience the same or similar change in cell Vt and the Vt of the reference cells do not track the changes in core cell Vt that result from the various reliability effects occurring within the core cells. The diverging Vt levels between the core cells and the reference cells in conventional dual bit flash memory devices can result in read errors, or what is often referred to as a reduced read margin.

In order to preserve the read margin, some conventional devices implemented two reference cells. The two reference cells are programmed to a "0". The average current of the two reference cells is then used as the reference current. Further, the cells are programmed and erased along with the core cells so that they undergo the same, or similar charge loss as the core cells. A problem with this approach is that each cell's threshold voltage Vt can vary due to processing differences and differing effects for operations such as erase, program, read, etc. These differences can greatly effect the average Vt for the two cells. Since the average Vt is used for comparison with the core cell, even small variations in the average Vt can have a significant effect on the read margin. For example, if the average Vt shifts too high, then the difference from the threshold value for a data "0' becomes small reducing the read margin for a data "0". Similarly, if the average Vt shifts too far down, then the read margin for a data "1" becomes small.

Another approach sometimes used in conventional devices is to use two reference cells where the second reference cell is programmed to a threshold voltage based on a threshold voltage of the first reference cell. In this manner, if the first reference cell has a lower threshold voltage Vt, then the second cell can be programmed with a higher Vt, and vise versa, in order to maintain a more constant average Vt. Further, the reference cells can be cycled with the core cells so that they experience the same aging as the core cells. A draw back to this approach is that it takes a lot of time and that the average Vt is still hard to controlled.

SUMMARY

A dual bit flash memory devices uses a single reference cell, or array of cells, where the first bit of the reference cell is programmed to a Low Threshold Voltage level (LVT), while the second bit is programmed to a High Threshold Voltage level (HVT). This causes the Vt for the reference cell to be slightly above the LVT for the core cells, which enables an accurate determination of the data stored in the core cells.

In another aspect, the single array of reference cells is cycled with the core cells to ensure that the reference cells experience the same aging as the core cells.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION OF THE PREFERRED EMBODIMENTS

Figure 1:
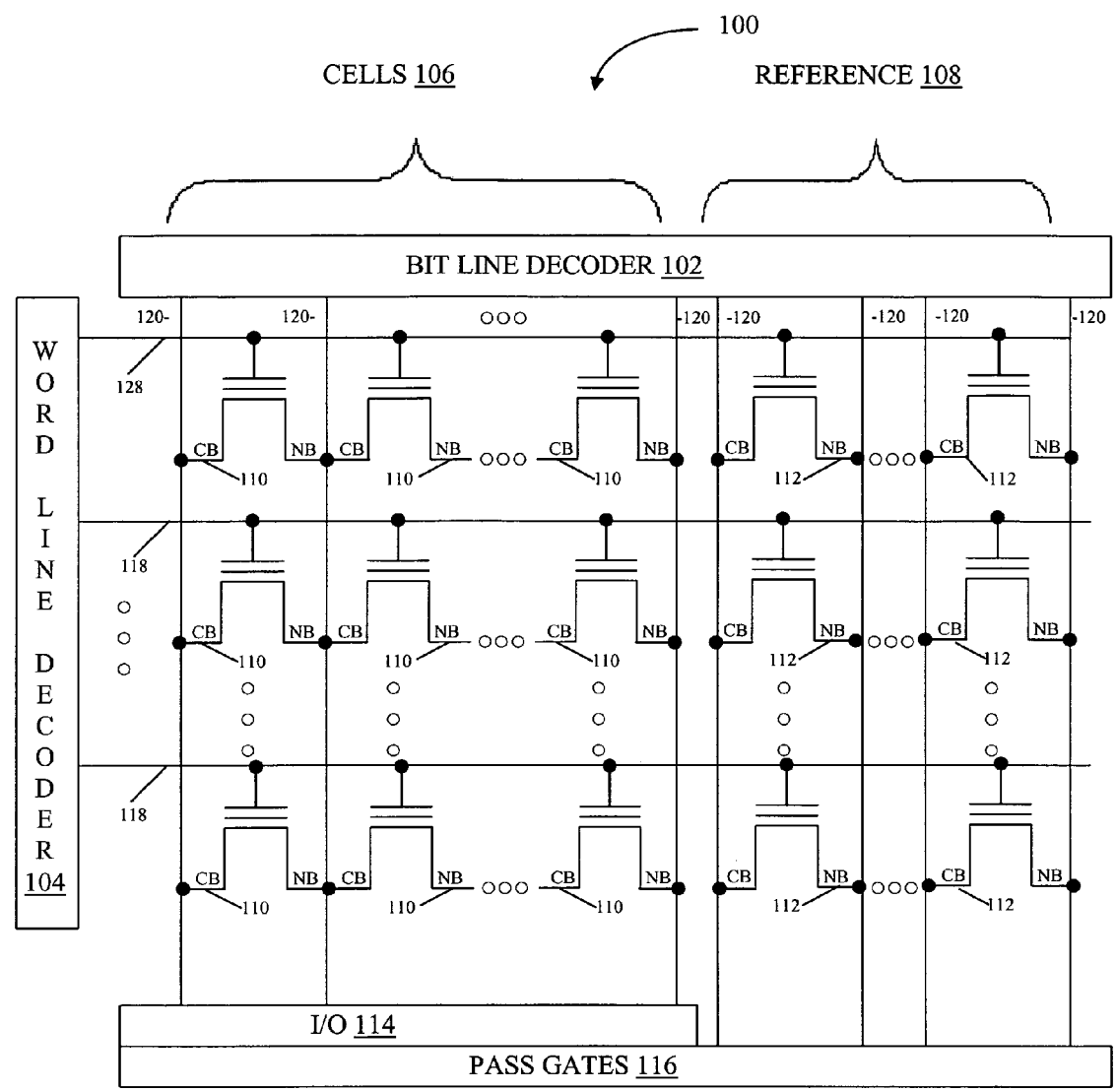
FIG. 1 is diagram illustrating an example dual bit flash memory architecture in accordance with one embodiment.

FIG. 1 is a diagram illustrating an example dual bit flash device 100 configured in accordance with one embodiment of the systems and methods described herein. Device 100 comprises dual bit flash cells 110 and 112. Cells 110 comprise an array of core cells 106, which are programmed with data. Cells 112 comprise a reference array 108, which is used to verify the data of cells 110 in accordance with the systems and methods described herein. The control gates of cells 110 and 112 are coupled with a word line decoder 104 via word lines 118. The remaining terminals of cells 110 and 112 are coupled with bit line decoder 102 via bit lines 120. A given cell 110, and the associated reference cell 112, can be addressed by activating the appropriate word line 118 and bit line 120. An Input/Output (I/O) device 114 can be coupled with array 106. Data from I/O 114 and reference array 108 can be controlled by a series of pass gates 116.

In accordance with the systems and methods described herein, reference array 108 is cycled along with core cell array 106 so that cells 112 experience the same aging as core cells 110. Further, to ensure that the read margin is maintained, the first bit of reference cells 112 is programmed to a LVT, while the second bit is programmed to a HVT. For example, as will be explained, in certain embodiments, after erase, reference cells 112 are programmed to the LVT High Bound (LVTHB) so that the core cells can be read as "1" and the second bit of the reference cells 112 is programmed to the HVT, which results in a second bit, or complementary bit, effect within reference cells 112. Programming a cell 112 in this fashion allows for accurate reads, and sufficient read margin, and only requires a single reference array, which can reduce the size and/or increase the density of device 100 compared to conventional devices.

The ability of conventional dual bit flash memory devices to maintain the read margin is compromised by several factors. For example, a core cells' Vt is determined by the flash internal program/erase algorithm. But near the end of life, there are several charge gain/charge loss mechanisms that impact the core cells' Vt. One of these mechanisms is the second bit effect, or complementary bit effect. The second bit effect means that the Vt of the first bit will increase slightly as the second bit is programmed. This effect gets progressively worse with the number of program/erase (P/E) cycles. For example, the Vt of the first bit can increase approximately 200 mv after the first P/E cycle, but can increase to as much as 400 mv after approximately 100,000 cycles.

A second factor that can effect dual bit flash operation is the charge gain effect. Here, the LVT cells show an increase in Vt over time. These cells can gain as much as 300 mv for 10 years. The charge gain effect is also dependent on P/E cycles.

Another factor that can effect the operation of conventional dual bit flash memory devices is the charge loss effect as in floating gate flash devices. Also this effect is dependent on P/E cycles.

As a result of effects such as those just described, the Vt of a dual bit flash memory cells is generally changing over time and P/E cycles. It can, therefore, be preferable to use a dynamic read reference cell to counter these effects. The question then becomes, how to define the Vt of such a dynamic read reference cell in a manner that preserves the read margin even through the end of life? One approach, used in some conventional devices, is to use two reference cells and program one to LVT and the other to HVT and average the two. The purpose of programming the reference cell in this manner is to locate the reference cells' Vt in the middle of the "1" cells and "0" cells' to ensure sufficient read margin for both "1" cells and "0" cells. Unfortunately, there are also Vt distributions associated with the reference cells 112. The Vt of the average of any two reference cells 112 will not be right in the middle of the "1" cells and "0" cells' distribution. Moreover, such approaches require the use of two reference arrays.

Figure 4:
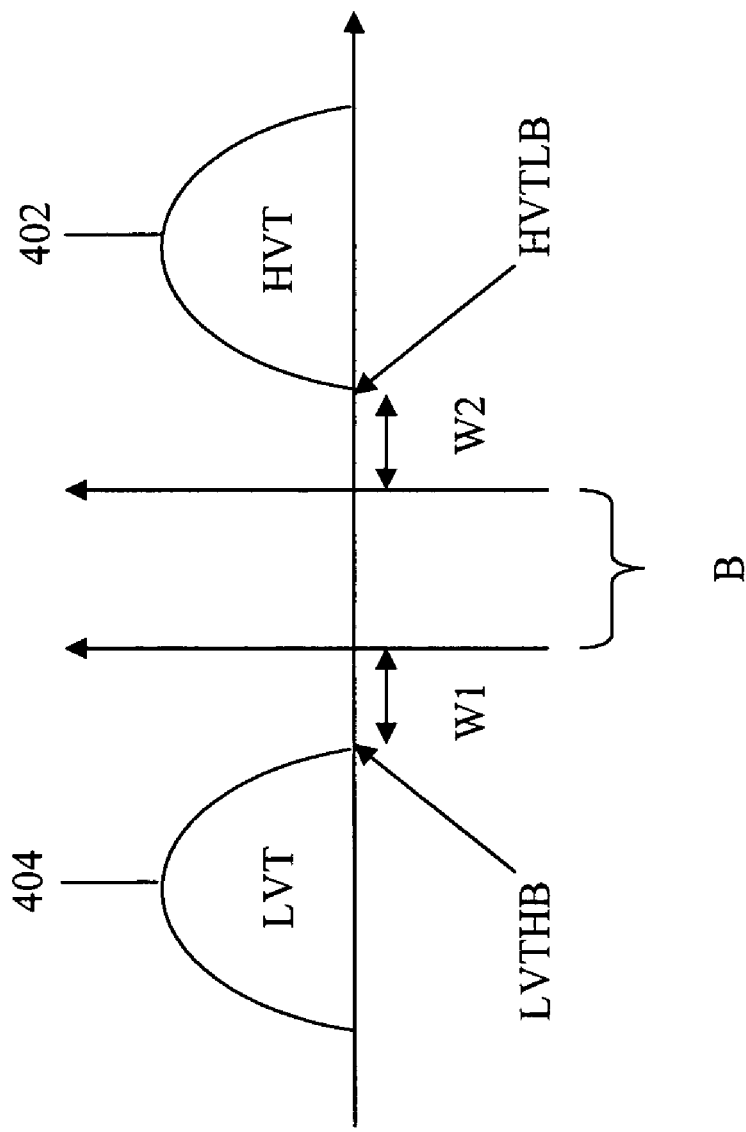
FIG. 4 is a diagram illustrating an example threshold voltage distribution for reference cells in the device of FIG. 1.

In the systems and methods described herein, however, a single reference array is used. Rather than trying to average LVT and HVT using two reference cells, the new concept is to reserve minimum but sufficient margin for "1" cells and leave the remainder of the window for "0" cells. The reference cells are erased along with the core cells. The reference cells are then programmed to LVTHB by verifying the core cells to be "1." The second bit of the reference cells are then programmed to a HVT value in order to erase a second bit effect on the reference cells. This results in a Vt for the reference cell that is slightly above LVT for the core cells and ensures sufficient read margin to the end of life. An example Vt distribution is illustrated in FIG. 4. The plot 404 on the left illustrates an example LVT distribution. As can be seen, LVT cells will have threshold voltages distributed over a range. The high end of the range is referred to as the High Bound. Thus, the voltage level at the right of LVT distribution 404 is referred to as the LVTHB. The plot 402 on the right illustrates an example HVT distribution. Again, HVT cells will have threshold voltages over a range, where the lower end of the range is termed the HVT Low Bound (HVTLB).

In one embodiment of the systems and methods described herein, each reference cell 112 is programmed to LVTHB and the second bit is programmed to HVT. The goal is to have the cell Vt for each reference cell 112 in the range B as shown in FIG. 4. In certain embodiments a predetermined guard bands, or windows, w1 and w2 are used to ensure that the circuit will function properly over varying conditions, such as temperature and supply voltage. It can be preferable that the actual Vt for the reference cell be at the lower end of the range B, since the Vt of reference cells 112 need only be slightly higher than the LVT of core cells 110 to determine whether a core cell 110 contains a "0" or a "1".

Figure 3:
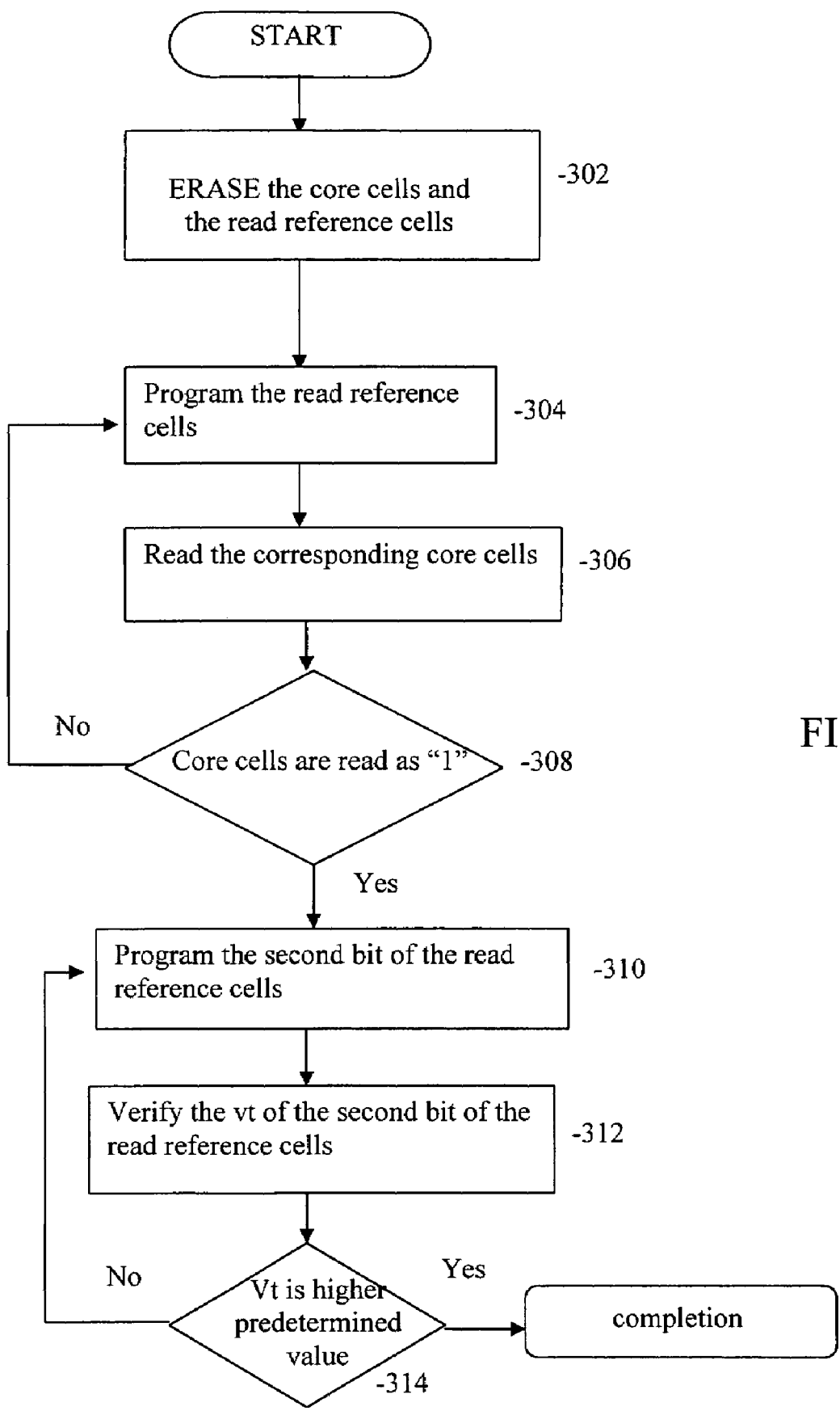
FIG. 3 is a flow chart illustrating an example method of operation for the device of FIG. 1 in accordance with one embodiment.

FIG. 3 is a flow chart illustrating an example method for programming a reference array, such as array 108 in accordance with the systems and methods described herein. In step 302, all of the core cells 110 and read reference cells 112 are erased. In step 304, the reference cells 112 can be programmed to a value that allows the core cells to be read as "1" in step 306. This Vt will be closed to the LVTHB. If core cells 110 cannot be read as a "1", then in step 308, the process can be caused to revert to step 302.

In step 310, the second bit of reference cells 112 can be programmed to a HVT value causing second bit effect on the read reference cells 112. The Vt for the reference cells 112 can be verified in step 312. If the reference cell Vt is greater than a predetermined value as, determined in step 314, then the process can revert to step 310. The predetermined Vt value should be such that the core cells 110 can be read by comparing the read current of cell 110 with the current of the associated reference cell 112.

Figure 2:
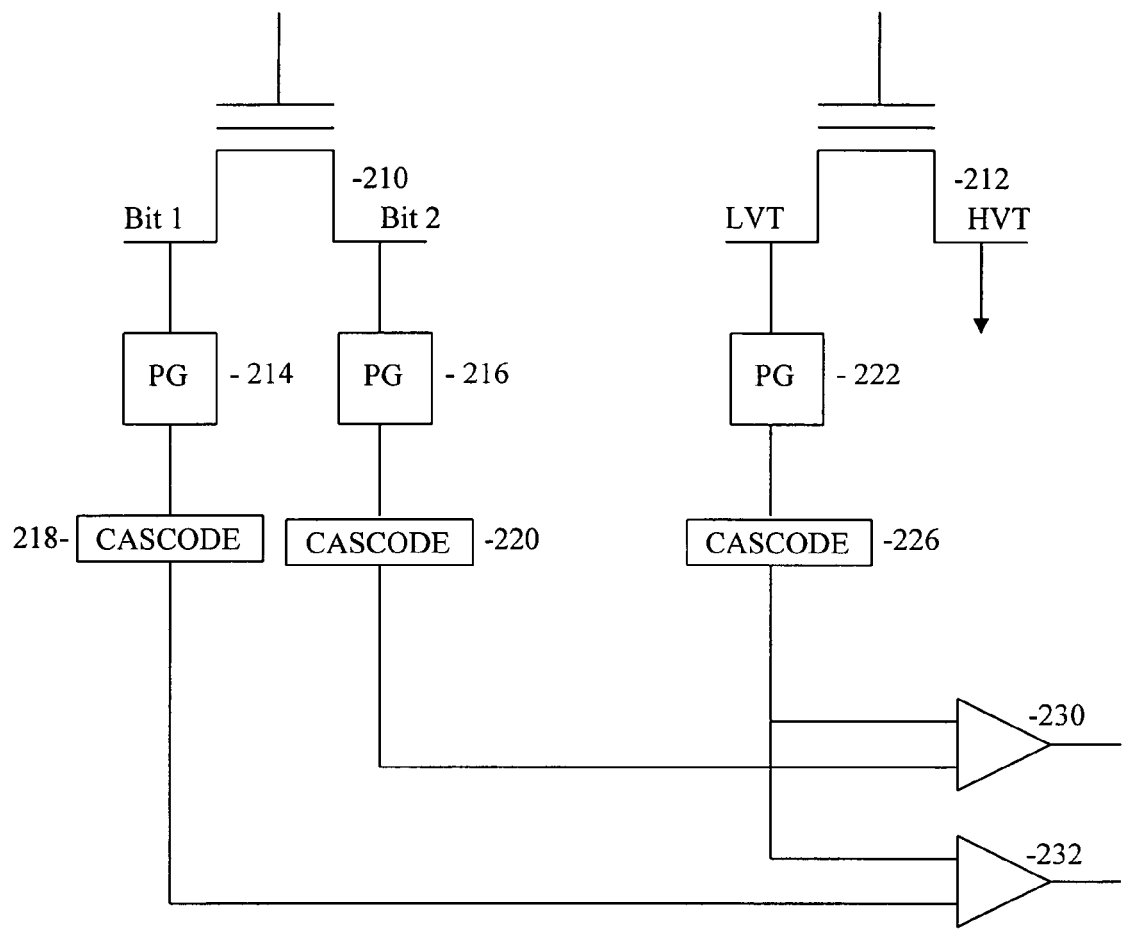
FIG. 2 is a diagram illustrating the operation of the device of FIG. 1 with respect to a single core cell and a single reference cell.

This last step can be illustrated with the aid of FIG. 2, which illustrates a single core cell 210 and a single reference cell 212. Core cell 210 comprises a first bit (bit 1) and a second bit (bit 2). Data from cell 210 can be passed to cascode amplifiers 218 and 220 via pass gates 214 and 216, respectively. Similarly, pass gate 222 can supply the reference to a cascode amplifier 226. The outputs of cascode amplifiers 218, 220, and 226 can then be input to sense circuits 230 and 232. Sense circuits 230 and 232 can be configured to compare the memory cell current with the reference cell current to determine whether the cell data is a "1" or "0".

By implementing the systems and methods described herein, the read margin for a dual bit flash memory cell can be maintained, even through the end of life. While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed:

1. A dual bit flash device, comprising:
   a core cell array, each cell of the core cell array configured to store two bits of data; and
   a single reference array coupled with the core cell array, each cell of the single reference array comprising a first bit programmed to a low threshold voltage and a second bit programmed to a high threshold voltage, the single reference array configured such that the program state of any core cell in the core cell array can be verified using a single reference cell in the single reference cell array.

2. The dual bit flash device of claim 1, wherein the first bit of each of the cells in the reference array is programmed to a high bound low threshold voltage.

3. The dual bit flash device of claim 2, wherein the second bit of each of the cells in the reference array is programmed to a low bound high threshold voltage.

4. The dual bit flash device of claim 1, wherein the low threshold voltage and the high threshold voltage are configured such that the threshold voltage for each of the cells in the reference array is within a defined range.

5. The dual bit flash device of claim 4, wherein the low threshold voltage and the high threshold voltage are configured such that the threshold voltage for each of the cells in the reference array is at a lower end of a defined range.

6. The dual bit flash device of claim 4, wherein the low end of the defined range is separated from the high bound low threshold voltage by a guard band.

7. The dual bit flash device of claim 4, wherein the high end of the defined range is separated from low bound high threshold voltage by a guard band.

8. The dual bit flash memory of claim 1, further comprising a sense circuit configured to compare a read current for one of the cells in the core array with a current for a cell in the reference array.

9. The dual bit flash memory of claim 1, further comprising an input/output circuit coupled with the core cell array.

10. The dual bit flash memory of claim 1, further comprising pass gates coupled with the core cell and reference cell arrays.

11. The dual bit flash memory of claim 1, further comprising a word line decoder coupled via word lines with control gates associated with core cells and reference cells of the core cell and reference cell arrays, respectively.

12. The dual bit flash memory of claim 1, further comprising a bit line decoder coupled via bit lines with terminals associated with core cells and reference cells of the core cell and reference cell arrays, respectively.

13. A method for cycling a dual bit flash memory device comprising a core cell array, each core cell of the core cell array configured to store two bits of information, and a single reference array, each reference cell of the single reference array configured to store two bits of information, comprising:
   programming each bit of each core cell in the core cell array and each bit of each reference cell in the reference array;
   erasing each bit of each core cell in the core cell array and each bit of each reference cell in the reference array;
   programming a first bit of each reference cell in the reference array to a low threshold voltage;
   programming a second bit of each reference cell in the reference array to a high threshold voltage; and
   generating a read current for one of the programmed core cells and comparing the read current to a single reference cell of the single reference array.

14. The method of claim 13, wherein the first bit of the reference cells is programmed to a high bound low threshold voltage.

15. The method of claim 13, wherein the second bit of the reference cells is programmed to a low bound high threshold voltage.

16. A dual bit flash device, comprising:
   a core cell array, each cell of the core cell array configured to store two bits of data; and
   a single reference array, each cell of the single reference array comprising a first bit programmed to a low threshold voltage and a second bit programmed to a high threshold voltage, wherein the first bit of each of the cells in the reference array is programmed to a high bound low threshold voltage.

17. The dual bit flash device of claim 16, wherein the second bit of each of the cells in the reference array is programmed to a low bound high threshold voltage.

18. The dual bit flash device of claim 16, wherein the low threshold voltage and the high threshold voltage are configured such that the threshold voltage for each of the cells in the reference array is within a defined range.

19. The dual bit flash device of claim 18, wherein the low threshold voltage and the high threshold voltage are configured such that the threshold voltage for each of the cells in the reference array is at a lower end of a defined range.

20. The dual bit flash device of claim 18, wherein the low end of the defined range is separated from the high bound low threshold voltage by a guard band.

21. The dual bit flash device of claim 18, wherein the high end of the defined range is separated from low bound high threshold voltage by a guard band.

22. The dual bit flash memory of claim 16, further comprising a sense circuit configured to compare a read current for one of the cells in the core array with a current for a cell in the reference array.

23. The dual bit flash memory of claim 16, further comprising an input/output circuit coupled with the core cell array.

24. The dual bit flash memory of claim 16, further comprising pass gates coupled with the core cell and reference cell arrays.

25. The dual bit flash memory of claim 16, further comprising a word line decoder coupled via word lines with control gates associated with core cells and reference cells of the core cell and reference cell arrays, respectively.

* * * * *